United States Patent
Ji et al.

(10) Patent No.: US 8,273,639 B2
(45) Date of Patent: Sep. 25, 2012

(54) ATOMIC LAYER DEPOSITION METHOD AND SEMICONDUCTOR DEVICE FORMED BY THE SAME

(75) Inventors: Hua Ji, Shanghai (CN); Min-Hwa Chi, Shanghai (CN); Fumitake Mieno, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 732 days.

(21) Appl. No.: 12/132,459

(22) Filed: Jun. 3, 2008

(65) Prior Publication Data

US 2008/0315295 A1 Dec. 25, 2008

(30) Foreign Application Priority Data

Jun. 22, 2007 (CN) .......................... 2007 1 0042457

(51) Int. Cl.
*H01L 21/20* (2006.01)
(52) U.S. Cl. ........ 438/478; 438/479; 438/482; 438/483; 438/488
(58) Field of Classification Search .................. 438/478, 438/479, 482, 483, 488
See application file for complete search history.

(56) References Cited

U.S. PATENT DOCUMENTS

| | | | |
|---|---|---|---|
| 6,124,158 A | 9/2000 | Dautartas et al. | |
| 2005/0032317 A1* | 2/2005 | Sandhu | 438/287 |
| 2006/0264031 A1* | 11/2006 | Xi et al. | 438/627 |
| 2007/0023856 A1* | 2/2007 | Sandhu | 257/506 |
| 2007/0212484 A1* | 9/2007 | Li | 427/248.1 |
| 2007/0259534 A1* | 11/2007 | Reid et al. | 438/783 |

FOREIGN PATENT DOCUMENTS

| | | |
|---|---|---|
| CN | 1384221 A | 12/2002 |
| CN | 1671882 A | 9/2005 |
| CN | 101330015 | 12/2008 |
| EP | 0 252 756 A2 | 1/1988 |

\* cited by examiner

*Primary Examiner* — Jae Lee
(74) *Attorney, Agent, or Firm* — Squire Sanders (US) LLP

(57) ABSTRACT

Disclosed are atomic layer deposition method and a semiconductor device including the atomic layer, including the steps: placing a semiconductor substrate in an atomic layer deposition chamber; feeding a first precursor gas to the semiconductor substrate within the chamber to form a first discrete monolayer on the semiconductor substrate; feeding an inert purge gas to the semiconductor substrate within the chamber to remove the first precursor gas which has not formed the first discrete monolayer on the semiconductor substrate; feeding a second precursor gas to the chamber to react with the first precursor gas which has formed the first discrete monolayer, forming a discrete atomic size islands; and feeding an inert purge gas to the semiconductor substrate within the chamber to remove the second precursor gas which has not reacted with the first precursor gas and byproducts produced by the reaction between the first and the second precursor gases.

14 Claims, 8 Drawing Sheets

US 8,273,639 B2

ATOMIC LAYER DEPOSITION METHOD AND SEMICONDUCTOR DEVICE FORMED BY THE SAME

This application claims the priority of Chinese Patent Application No. 200710042457.9, filed Jun. 22, 2007, the entire disclosure of which is incorporated herein by reference.

FIELD OF THE INVENTION

The present invention relates to a method for manufacturing a semiconductor device, and more particularly, to an atomic layer deposition method and a semiconductor device manufactured by the same.

DESCRIPTION OF THE RELATED ART

Atomic layer deposition (ALD) is originally referred to as Atomic Layer Epitaxy (ALE), and is also termed as Atomic Layer Chemical Vapor Deposition (ALCVD).

Atomic layer deposition (ALD) involves the deposition of successive single layers over a semiconductor substrate within a deposition chamber typically maintained at a negative pressure (a pressure below the atmospheric pressure). An exemplary method is disclosed in the Chinese patent application No. 03818269.6, which comprises feeding a first vaporized precursor to a deposition chamber to form a first monolayer 110 on a semiconductor substrate 100 placed in the deposition chamber, as shown in FIG. 1; thereafter, ceasing the flow of the first vaporized precursor, and feeding an inert purge gas through the chamber to remove all remaining first vaporized precursor which is not absorbed to the semiconductor substrate 100, as shown in FIG. 2; Subsequently, feeding a second vaporized precursor which is different from the first precursor to the deposition chamber to form a second monolayer 120 on or with the first monolayer 110, wherein the second monolayer 120 may react with the first monolayer 110, as shown in FIG. 3; and ceasing the flow of the second vaporized precursor, and feeding an inert purge gas through the chamber to remove all remaining second monolayer 120 which is not absorbed to the first monolayer 110, as shown in FIG. 4. The deposition of the first and the second monolayer may be repeated until a layer having a desired thickness and composition is formed on the semiconductor substrate.

However, the atomic layer composed of the first monolayer and the second monolayer formed on a semiconductor substrate by the above ALD is a continuous distribution layer, and is mainly applied in holes or trenches with a large line width and aspect ratio in the conventional process for manufacturing a semiconductor device.

With the development of the process for manufacturing a semiconductor device, the critical dimension of semiconductor device becomes smaller and the requirement for the storage density of semiconductor device becomes higher. In the process for manufacturing the semiconductor device with a three-layer stack structure of medium layer-charge trapping layer-medium layer, the use of a charge trapping layer having discrete atomic islands (nano-dot) instead of a charge trapping layer having a continuous thickness in the prior art may decrease the lateral current leakage, reduce the thickness of the charge trapping layer, and improve the memory capacity of the semiconductor device. However, in the prior art, the charge trapping layer having discrete atomic islands (nano-dot) is generally formed by chemical vapor deposition or physical vapor deposition, and the size of the resulting atomic islands is in a range of 10 nm to 100 nm, and the size distribution of the atomic islands is non-uniform.

SUMMARY OF THE INVENTION

In view of the above requirements, the present invention provides an atomic layer deposition method to form a monolayer of discrete atomic size islands, and further provides a semiconductor device with a three-layer stack structure of medium layer-charge trapping layer-medium layer, wherein the charge trapping layer comprises discrete atomic size islands having an atomic level and an uniform size distribution.

In an aspect according to the present invention, there is provided an atomic layer deposition method comprising the steps of:

placing a semiconductor substrate in an atomic layer deposition chamber;

feeding a first precursor gas to the semiconductor substrate within the chamber to form a first discrete monolayer on the semiconductor substrate;

feeding an inert purge gas to the semiconductor substrate within the chamber to remove the first precursor gas which has not formed the first discrete monolayer on the semiconductor substrate;

feeding a second precursor gas to the chamber to react with the first precursor gas which has formed the first discrete monolayer, thereby forming a discrete atomic size islands; and feeding an inert purge gas to the semiconductor substrate within the chamber to remove the second precursor gas which has not reacted with the first precursor gas and byproducts produced by the reaction between the first and the second precursor gases.

In another aspect according to the present invention, there is provided an atomic layer deposition method comprising the steps of:

placing a semiconductor substrate in an atomic layer deposition chamber;

feeding a first precursor gas to the semiconductor substrate within the chamber to form a first discrete monolayer on the semiconductor substrate;

feeding an inert purge gas to the semiconductor substrate within the chamber to remove the first precursor gas which has not formed the first discrete monolayer on the semiconductor substrate;

feeding a second precursor gas to the chamber to react with the first precursor gas which has formed the first discrete monolayer, thereby forming a discrete atomic size islands;

feeding an inert purge gas to the semiconductor substrate within the chamber to remove the second precursor gas which has not reacted with the first precursor gas and byproducts produced by the reaction between the first and the second precursor gases; and forming a dielectric layer to cover the discrete atomic size islands on the semiconductor substrate.

Optionally, the dielectric layer is formed by ALD method, which comprises the following steps:

feeding a third precursor gas to the chamber to form a third monolayer over the semiconductor substrate and the discrete atomic size islands, wherein the third monolayer fills the space between the discrete atomic size islands;

feeding an inert purge gas to the chamber to remove the third precursor gas which has not formed the third monolayer above the semiconductor substrate and the discrete atomic size islands;

feeding a fourth precursor gas to the chamber to react with the third precursor gas which has formed the third monolayer so as to form a dielectric monoatomic layer;

feeding an inert purge gas to the chamber to remove the fourth precursor gas which has not formed the dielectric monoatomic layer and byproducts produced by the reaction between the third and the fourth precursor gases; and repeating the above steps until the resulting dielectric layer has a given thickness to cover the discrete atomic size islands.

In yet another aspect according to the present invention, there is provided a semiconductor device comprising a semiconductor substrate, a three-layer stack structure of medium layer-charge trapping layer-medium layer disposed on the semiconductor substrate, a gate disposed on the three-layer stack structure, and a source and a drain disposed in the semiconductor substrate at each side of the three-layer stack structure, wherein the charge trapping layer is a dielectric layer containing the discrete atomic size islands formed by the ALD deposition method.

As compared with the prior art, the present invention has the following advantages:

The present invention provides an atomic layer deposition method, by which a first discrete monolayer is formed over a semiconductor substrate and discrete atomic size islands are formed finally. The islands with precisely same atomic size between each other are discretely deposited on the semiconductor substrate as discrete nano-dot distribution.

Further, in the atomic layer deposition method, a first discrete monolayer is formed on a semiconductor substrate by controlling the feeding of the first precursor gas to the deposition chamber, for example, by reducing the flow rate of the first precursor gas and the deposition time. And also the distribution density of the first monolayer on the semiconductor substrate is adjusted by controlling the flow rate and time of the first precursor gas feeding to the deposition chamber.

The present invention further provides an atomic layer deposition method, by which discrete atomic size islands are sealed within a dielectric layer having a thickness which may be controlled in atomic level. The formed structure may be used in the manufacture of a semiconductor device, for example, as a charge trapping layer of a semiconductor memory device.

The present invention further provides a semiconductor device which comprises a three-layer stack structure of medium layer-charge trapping layer-medium layer, in which the charge trapping layer is a dielectric layer comprising discrete atomic size islands. The size of the islands is at atomic level and is controllable and has a uniform distribution.

Furthermore, the distribution density of the discrete atomic size islands in the dielectric layer may be adjusted by controlling the atomic layer deposition process through which the discrete atomic size islands is formed.

The semiconductor device according to the present invention has a small line width and improves the density of well in the charge trapping layer, thus enhance the charge trapping capability. And also it may improve the insulating capacity between the discrete atomic size islands, thereby reducing lateral current leakage of the device.

SPECIFIC EMBODIMENTS OF THE INVENTION

An object of the present invention is to provide an atomic layer deposition method by which discrete atomic size islands are formed on a semiconductor substrate, wherein the discrete atomic size islands are discrete nano-dots with the size at atomic level, and the number of the islands is controllable.

Another object of the present invention is to provide a semiconductor device comprising a three-layer stack structure of medium layer-charge trapping layer-medium layer, in which the charge trapping layer is a dielectric layer comprising discrete atomic size islands formed by the ALD method.

The above objects, features and advantages of the present invention will be understood with respect to the following preferred embodiments given in conjunction with the accompanying drawings.

Embodiment 1

Figure 9:
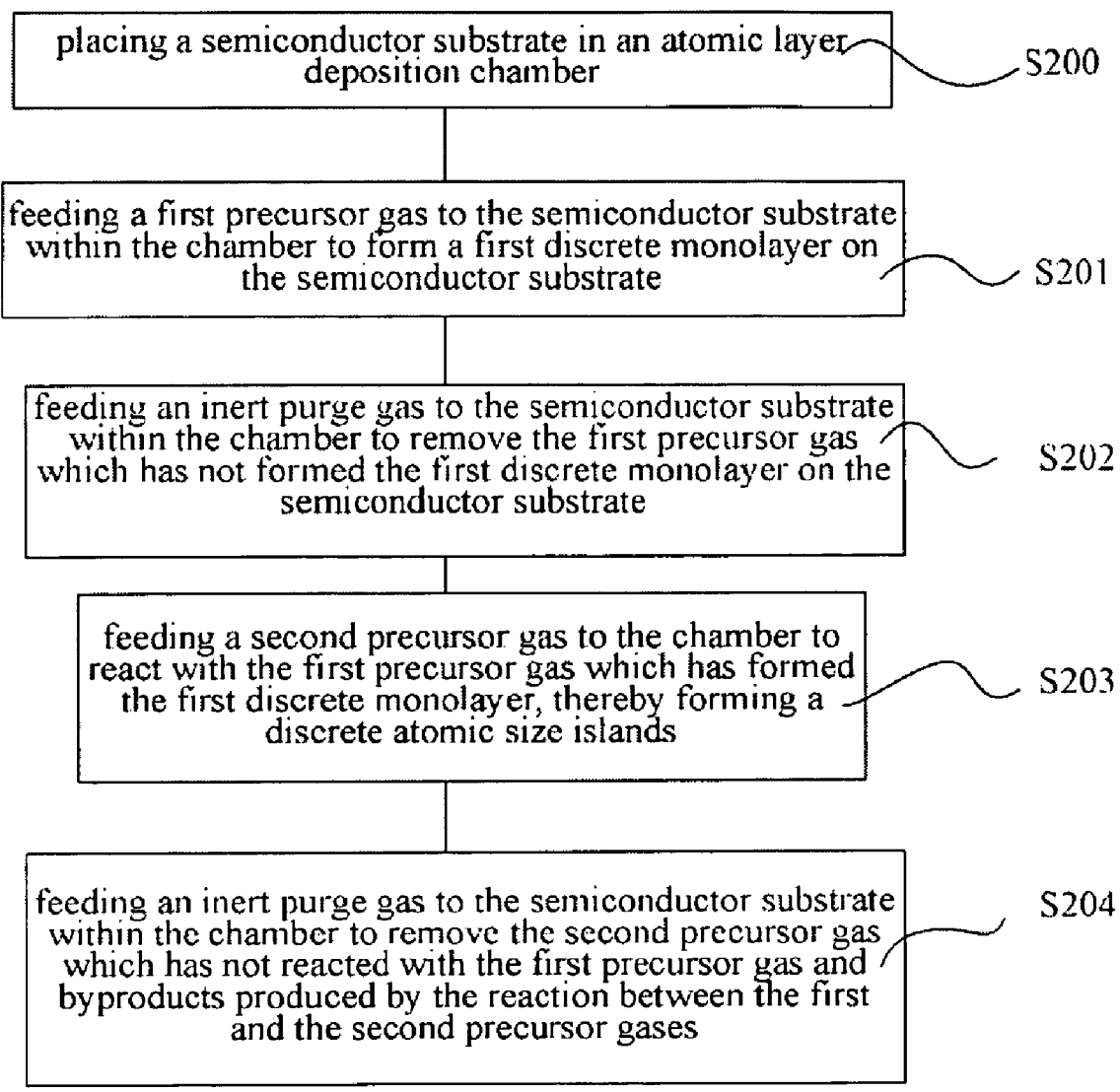
FIG. 9 is a flow diagram illustrating the atomic layer deposition process according to the first embodiment of the present invention.

An atomic layer deposition method is provided in this embodiment. Referring to the flow diagram shown in FIG. 9, the method comprises the steps of: placing a semiconductor substrate in an atomic layer deposition chamber (step S200); feeding a first precursor gas to the semiconductor substrate within the deposition chamber to form a first discrete monolayer on the semiconductor substrate (step S201); feeding an inert purge gas to the semiconductor substrate within the chamber to remove the first precursor gas which has not formed the first discrete monolayer (step S202); feeding a second precursor gas to the chamber to react with the first precursor gas which has formed the first discrete monolayer, thereby forming a discrete atomic size islands (step S203); and feeding an inert purge gas to the chamber to remove the second precursor gas which has not reacted with the first precursor gas and byproducts produced by the reaction between the first and the second precursor gases (step S204).

Firstly, referring to the step S200, a semiconductor substrate 200 is placed in an atomic layer deposition chamber. The deposition chamber is a common one used in the conventional reaction apparatus for atomic layer deposition. In order to distribute the reaction gas on the semiconductor substrate as uniformly as possible during atomic layer deposition process, the reaction gas feeding device of the deposition apparatus is preferably configured to enable gas to flow into the deposition chamber uniformly from various directions. For example, a shower-head type feeding device may be employed to make the distribution of discrete islands formed on the semiconductor substrate more uniform.

The semiconductor substrate 200 may be made of various semiconductor materials known to those skilled in the field, which includes silicon or silicon germanium (SiGe) with monocrystal or polycrystal structures, ion-doped Si or SiGe such as N-doped or P-doped Si or SiGe, compound semiconductor such as silicon carbide, indium antimonide, lead telluride, indium arsenide, indium phosphide, gallium arsenide or gallium antimonide, alloy semiconductor or the combination thereof, and silicon-on-insulator (SOI). The semiconductor substrate may be a blank semiconductor substrate, or a semiconductor substrate provided with various devices and wirings therein.

Figure 1:
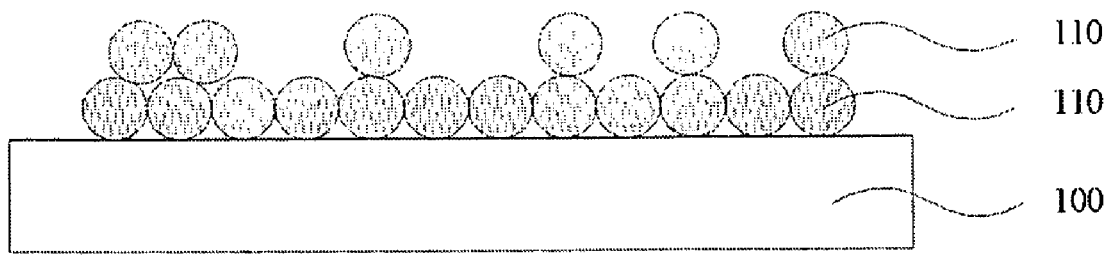
FIGS. 1 to 4 are structural diagrams illustrating an atomic layer deposition process according to the prior art.
Figure 2:
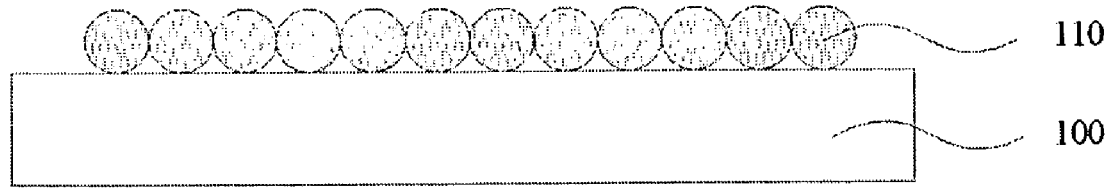
Figure 3:
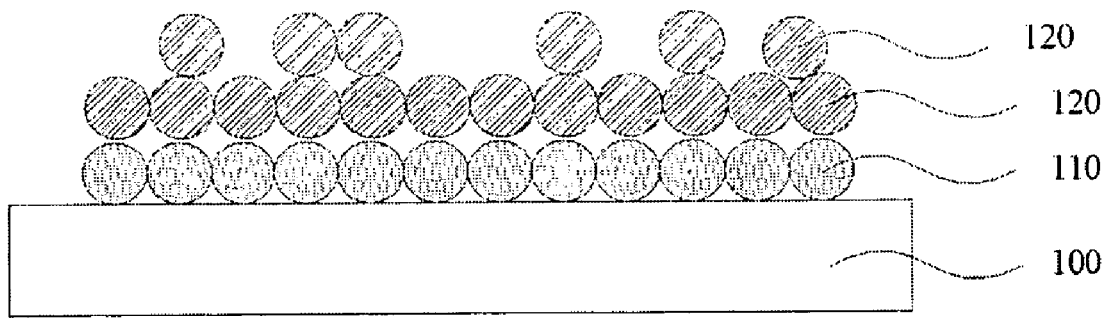
Figure 4:
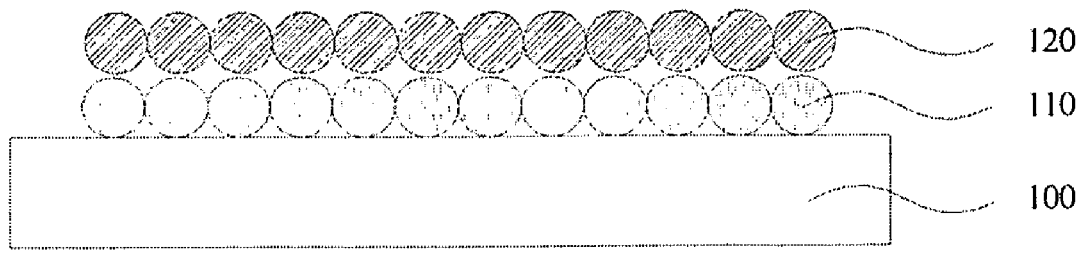
Figure 5:
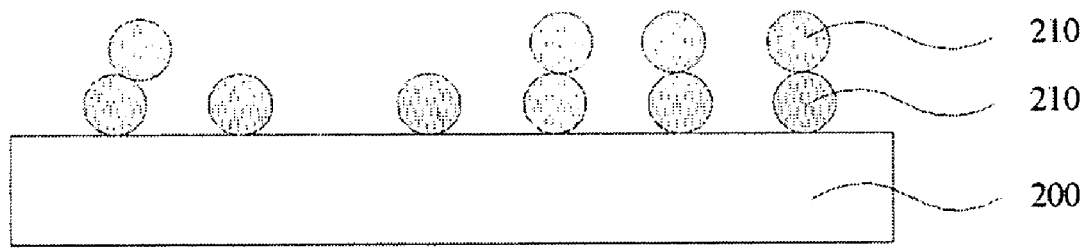
FIGS. 5 to 8 are structural diagrams illustrating an atomic layer deposition process according to a first embodiment of the present invention.

Referring to the step S201, a first precursor gas is fed to the semiconductor substrate 200 in the deposition chamber, as shown in FIG. 5. A first discrete monolayer 210 is formed on the semiconductor substrate 200 due to the physical or chemical adsorption between the first precursor gas and the semiconductor substrate. The atoms of the first precursor gas are also adsorbed on the first discrete monolayer 210 which is directly contacted with the semiconductor substrate 200 due to the mutual adsorption between the atoms of the first precursor gas.

The first precursor gas may be any of reaction gases having nucleation entities and being capable of effectively forming the first discrete monolayer 210 on the semiconductor substrate 200 via chemical or physical adsorption. The first precursor may comprise metal, semiconductor, metal bonded to halogen or organic ligands, and semiconductor bonded to halogen or organic ligands, or the mixture thereof. For example, the metal comprises Ta, Ti, W, Mo, Nb, Cu, Ni, Pt, Ru, Me, Ni and Al. The semiconductor comprises silicon. And the semiconductor bonded to halogen or organic ligands comprises $SiCl_2H_2$, $Si(OC_2H_5)_4$, $SiH_2[NH(C_4H_9)]_2$ and $SiH(OC_2H_5)_3$.

By way of example only, several particular first precursor gases are given herein for well understanding and implementing the invention by those skilled in the art. If the discrete atomic size islands to be formed are $Si_3N_4$ layer, the first precursor gas is a reaction gas with Si atom nucleation entity, such as $SiCl_2H_2$, $SiH_4$, $Si_2Cl_6$ or $SiH_2[NH(C_4H_9)]_2$.

If the discrete atomic size islands to be formed are HfO layer, the first precursor gas is a reaction gas with Hf atom nucleation entity, such as $Hf[N(CH_3)(C_2H_5)]_4$, $Hf[N(C_2H_5)_2]_4$, $Hf[OC(CH_3)_3]_4$, or $HfCl_4$.

If the discrete atomic size islands to be formed are $Al_2O_3$ layer, the first precursor gas is a reaction gas with Al atom nucleation entity, such as $Al(CH_3)_3$.

If the discrete atomic size islands to be formed are WN layer, the first precursor gas is a reaction gas with W atom nucleation entity, such as $WF_6$.

In order to form the discrete monolayer 210 on the semiconductor substrate 200 by the first precursor gas, the conditions under which the first precursor gas is fed to the deposition chamber should be controlled. The process parameters contributing to the discrete distribution of the first precursor gas on the semiconductor substrate 200 include the flow rate, feeding time, temperature, and pressure of the first precursor gas feeding into the deposition chamber.

The flow rate and feeding time of the first precursor gas feeding to the deposition chamber play a key role in achieving a discrete distribution. In this embodiment, in order to form the discrete monolayer on the semiconductor substrate, the flow rate and feeding time of the first precursor gas feeding to the deposition chamber should be lower than them in the process of forming a continuous monolayer in prior art. The feeding of the first precursor gas has been ceased before the first precursor gas adsorbed on the semiconductor substrate 200 forms a dense and continuous distribution layer, so that the first discrete monolayer 210 is formed. In a preferred example, the flow rate of the first precursor gas to the deposition chamber may be decreased considerably while the feeding time is properly increased, thereby improve the controllability of the process.

In this embodiment, the distribution density of the first precursor gas which forms the first monolayer on the semiconductor substrate can be controlled by controlling the flow rate and feeding time of the first precursor gas feeding to the atomic layer deposition chamber.

In the prior art, the flow rate and feeding time required for forming a dense monolayer on the semiconductor substrate are various from different first precursor gases. Similarly, in the embodiment of the present invention, the flow rate and feeding time required for forming a discrete first monolayer 210 are various from different first precursor gases. However, the process of forming a discrete first monolayer according to the present invention is based on the process of forming a dense first monolayer in the prior art and is performed by reducing the flow rate and feeding time of the first precursor gas. In the process of forming a discrete first monolayer according to the present invention, the first monolayer with a discrete distribution can be formed depending on the requirement of process design, and the distribution density of the first precursor gas for forming the discrete first monolayer is controllable.

In this embodiment, there is provided an example for implementing the invention by the skilled in the art. In the case that the final discrete atomic size island to be formed is $Si_3N_4$, the first precursor gas $SiCl_2H_2$ is fed into a conventional atomic layer deposition apparatus at a flow rate of 0.06~0.3 slm for a period of more than 0 to 10 seconds, preferably more than 0 to 7 seconds. The pressure under which the first precursor gas is fed into the deposition chamber is 500-800 Pa, and the temperature in the deposition chamber is in a range of 450-600° C., preferably at 550° C.

In another particular example, in the case that the final discrete atomic size island to be formed is $Al_2O_3$, nitrogen gas carrying the liquid of $Al(CH_3)_3$ is fed into a conventional atomic layer deposition apparatus as the first precursor gas. The temperature is set for 25° C., the flow rate of nitrogen gas is 0.03-0.15 slm, and the feeding time is more than 0 to 10 seconds, preferably more than 0 to 7 seconds. The pressure under which the first precursor gas is fed into the deposition chamber is in a range of 3-5 Pa, and the temperature in the deposition chamber is in a range of 250-450° C., preferably at 400° C.

Figure 6:
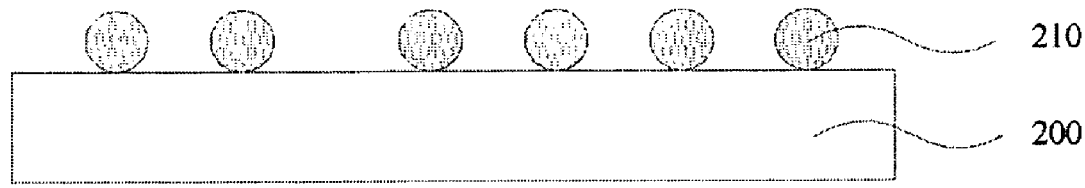

In the step S202, as shown in FIG. 6, an inert purge gas is fed to the semiconductor substrate 200 in the deposition chamber to remove the first precursor gas which has not formed the first discrete monolayer 210 on the semiconductor substrate 200. In this step, only the first precursor gas directly contacting the semiconductor substrate 200 is remained so that form the first monolayer 210 on the semiconductor substrate 200, and the other first precursor gas which is not adsorbed on the semiconductor substrate 200 directly is removed. The inert gas comprises He, Ne, Ar, and the like.

After purging by the inert gas, a uniform or non-uniform first monolayer 210 is formed on the semiconductor substrate in a monoatomic discrete distribution.

The purging of the inert gas can be performed according to any of the conventional processes in the prior art. For example, nitrogen ($N_2$) gas flows into and purges the deposition chamber at a flow rate of 5 slm under a pressure of 0.3 Torr.

Figure 7:
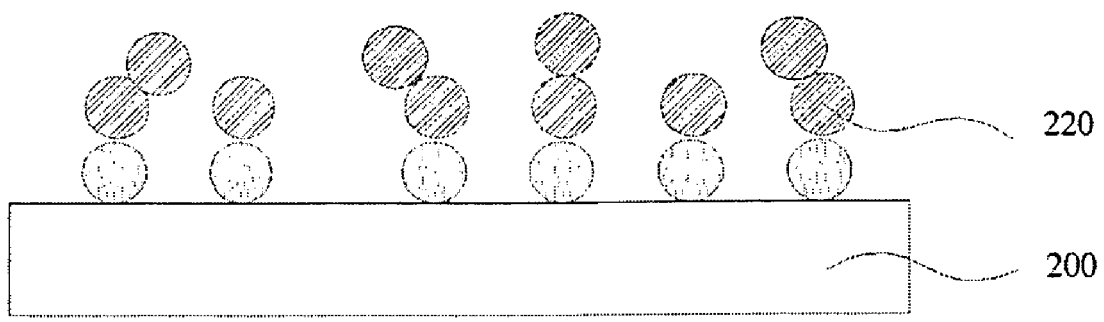

In the step S203, a second precursor gas is fed to the semiconductor substrate in the deposition chamber and reacts with the first precursor gas which has formed the first monolayer, thereby forming discrete atomic size islands. As shown in FIG. 7, the second precursor gas flows to the semiconductor substrate in the deposition chamber and reacts with the first precursor gas which has formed the first monolayer, thereby forming discrete atomic size islands 220. At the same time, the second precursor gas may be adsorbed on the semiconductor substrate 200 and the atoms of the second precursor gas may be adsorbed between each other due to the atomic adsorption force. Further, byproducts may be generated from the reaction between the second precursor gas and the first precursor gas in the deposition chamber.

Depending upon the discrete atomic size islands to be formed and the first precursor gas, the second precursor gas may be any substances that can react with the first precursor gas to generate the discrete atomic size islands.

In a particular example, the second precursor gas may comprise a material containing N or O or metal atoms as a reductant or oxidant, such as $NH_3$ or $O_2$.

By way of example only, the embodiment provides several particular second precursor gases. In the case that the final discrete atomic size island to be formed is $Si_3N_4$, the first precursor gas is a reactive gas having Si atom nucleation entity and the second precursor gas is a gas that can react with the nucleation entity of the first monolayer formed by the first precursor gas to form discrete atomic size islands, such as $NH_3$, $N_2O$, $N_2$ and the like.

In the case that the final discrete atomic size island 220 to be formed is HfO, the first precursor gas is a reactive gas having Hf atom nucleation entity and the second precursor gas is a gas that can react with the nucleation entity of the first monolayer formed by the first precursor gas to form discrete atomic size islands, such as $O_3$ and the like.

In the case that the final discrete atomic size island 220 to be formed is $Al_2O_3$, the first precursor gas is a reactive gas having Al atom nucleation entity and the second precursor gas is a gas that can react with the nucleation entity of the first monolayer formed by the first precursor gas to form discrete atomic size islands, such as $H_2O$ or $O_3$ and the like.

In the case that the final discrete atomic size island 220 to be formed is WN, the first precursor gas is a reactive gas having W atom nucleation entity, and the second precursor gas can be, for example, $NH_3$ and the like.

The process of feeding the second precursor gas into the semiconductor substrate in the deposition chamber can be performed by any conventional techniques known to the skilled in the art. For example, when the first precursor gas is $SiCl_2H_2$ and the final discrete atomic size island is $Si_3N_4$, $NH_3$ is used as the second precursor gas and fed into a conventional atomic layer deposition apparatus at a flow rate of 2-5 slm for a period of more than 0 to 30 seconds, while the pressure in the deposition chamber is 30-50 Pa, and the temperature in the deposition chamber is in a range of 450-600° C., preferably at 550° C.

Figure 8:
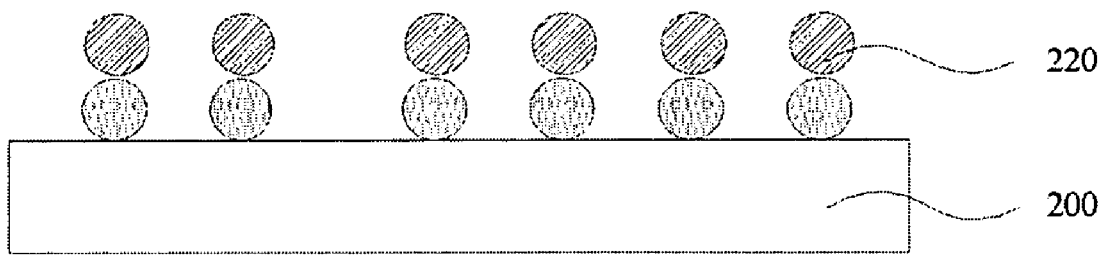

In the step S204, as shown in FIG. 8, an inert purge gas is fed to the semiconductor substrate in the deposition chamber to remove the second precursor gas which has not reacted with the first precursor gas and byproducts produced by the reaction between the first and the second precursor gases.

The inert gas can be He, Ne, Ar and the like.

The purging of the inert gas can be performed according to any of the conventional processes in the prior art. For example, nitrogen ($N_2$) gas flows into and purges the deposition chamber at a flow rate of 5 slm under a pressure of 0.3 Torr.

A monolayer of discrete atomic size islands can be formed on a semiconductor substrate by the deposition process as described above in the embodiment, and the monolayer of discrete atomic size islands can be made of any compounds that is formed by a conventional atomic layer deposition method in the prior art. Furthermore, the distribution density of the first monolayer and the monolayer of discrete atomic size islands can be controlled by controlling the injection process of the first precursor gas.

Embodiment 2

Figure 16:
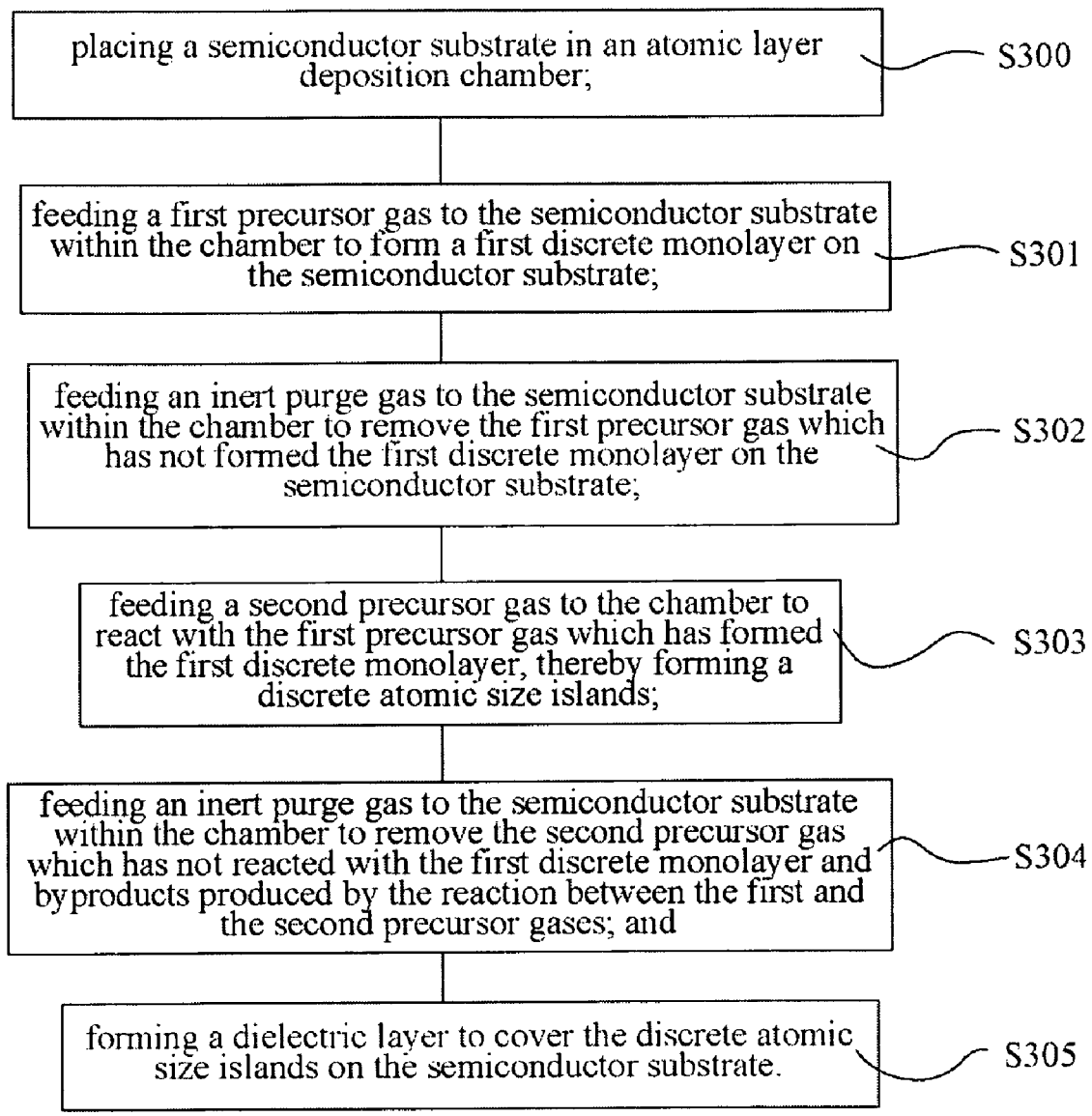
FIG. 16 is a flow diagram illustrating the atomic layer deposition process according to the second embodiment of the present invention.

An atomic layer deposition method is provided in this embodiment. Referring to the flow diagram shown in FIG. 16, the method comprises the steps of: placing a semiconductor substrate in an atomic layer deposition chamber (step S300); feeding a first precursor gas to the semiconductor substrate within the deposition chamber to form a first discrete monolayer on the semiconductor substrate (step S301); feeding an inert purge gas to the semiconductor substrate within the chamber to remove the first precursor gas which has not formed the first discrete monolayer (step S302); feeding a second precursor gas to the chamber to react with the first precursor gas which has formed the first discrete monolayer, thereby forming a discrete atomic size islands (step S303); and feeding an inert purge gas to the chamber to remove the second precursor gas which has not reacted with the first discrete monolayer and byproducts produced by the reaction between the first and the second precursor gases (step S304); and forming a dielectric layer on the semiconductor substrate to cover the monolayer of discrete atomic size islands (step S305).

Figure 10:
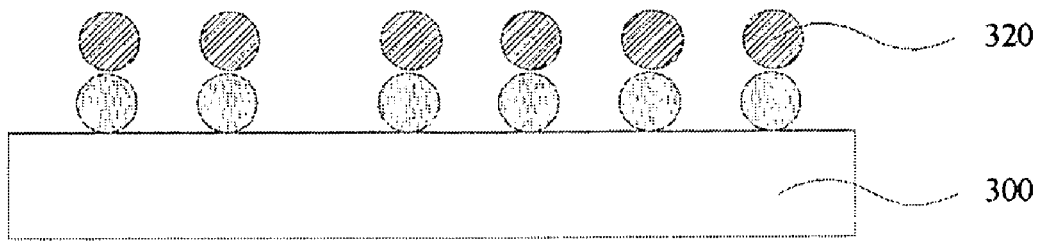
FIGS. 10 to 15 are structural diagrams illustrating an atomic layer deposition process according to a second embodiment of the present invention.

In the above steps, the steps S300 to S304 are performed sequentially as in embodiment 1. And after the step S304, the monolayer of discrete atomic size islands is formed on the semiconductor substrate, as shown in FIG. 10.

In the step S305, the process for forming the dielectric layer on the semiconductor substrate to cover the monolayer of discrete atomic size islands is preferably an atomic layer deposition process which may be any one known in the art. For example, forming the dielectric layer can be performed by the following steps:

feeding a third precursor gas to the chamber to form a third monolayer over the semiconductor substrate and the discrete atomic size islands, wherein the third monolayer fills the space between the discrete atomic size islands;

feeding an inert purge gas to the chamber to remove the third precursor gas which has not formed the third monolayer above the semiconductor substrate and the discrete atomic size islands;

feeding a fourth precursor gas to the chamber to react with the third precursor gas which has formed the third monolayer so as to form a dielectric monoatomic layer;

feeding an inert purge gas to the chamber to remove the fourth precursor gas which has not formed the dielectric monoatomic layer and byproducts produced by the reaction between the third and the fourth precursor gases; and repeating the above steps until the resulting dielectric layer has a given thickness to cover the discrete atomic size islands.

Figure 11:
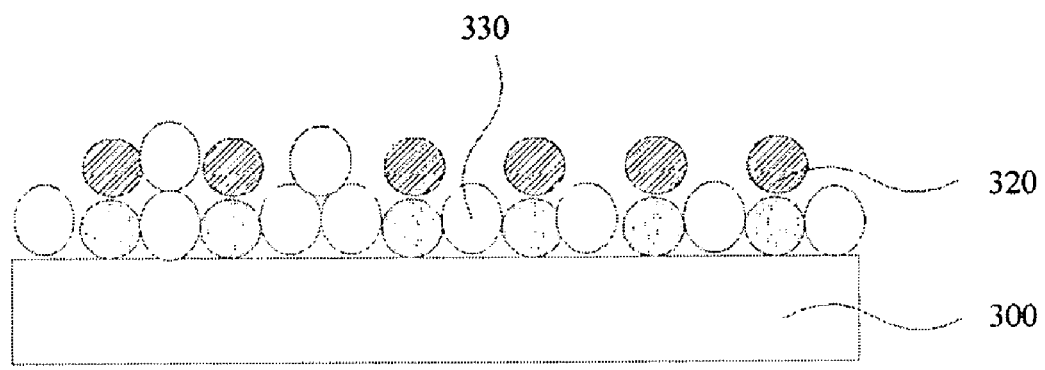

Referring to FIG. 11, the third precursor gas is fed to the semiconductor substrate 300 in the deposition chamber. Since the monolayer of discrete atomic size islands 320 has been formed on the semiconductor substrate 300, a third monolayer 330 is formed by the third precursor gas on both the semiconductor substrate 300 and the monolayer of discrete atomic size islands 320. Further, due to the discrete distribution of the islands on the semiconductor substrate 300, the third monolayer 330 on the semiconductor substrate 300 fills within the spacing between the discrete atomic size islands 320. The third precursor gas is bond to the monolayer of discrete atomic size islands 320 by means of interatomic force or chemical bonds.

The third precursor gas may be any of reaction gases having nucleation entities and being capable of effectively forming the third monolayer on both the semiconductor substrate and the monolayer 320 via chemical or physical adsorption. Furthermore, the third precursor gas may react with the fourth precursor gas to form insulation materials such as silicon oxide, silicon nitride, and silicon oxynitride.

By way of example only, several particular third precursor gases are given herein for well understanding and implementing the invention by those skilled in the art. For example, if the final dielectric layer to be formed is $Si_3N_4$, the third precursor gas can be $SiCl_2H_2$, $SiH_4$, $Si_2Cl_6$ or $SiH_2[NH(C_4H_9)]_2$ and the like.

If the final dielectric layer to be formed is $SiO_2$, the third precursor gas can be $Si(OC_2H_5)_4$, $SiH_2[NH(C_4H_9)]_2$, $SiH(OC_2H_5)_3$, $Si_2Cl_6$, or $SiHN[(CH_3)_2]_3$ and the like.

The process of feeding the third precursor gas into the semiconductor substrate in the deposition chamber can be performed by any conventional techniques known to the skilled in the art.

Figure 12:
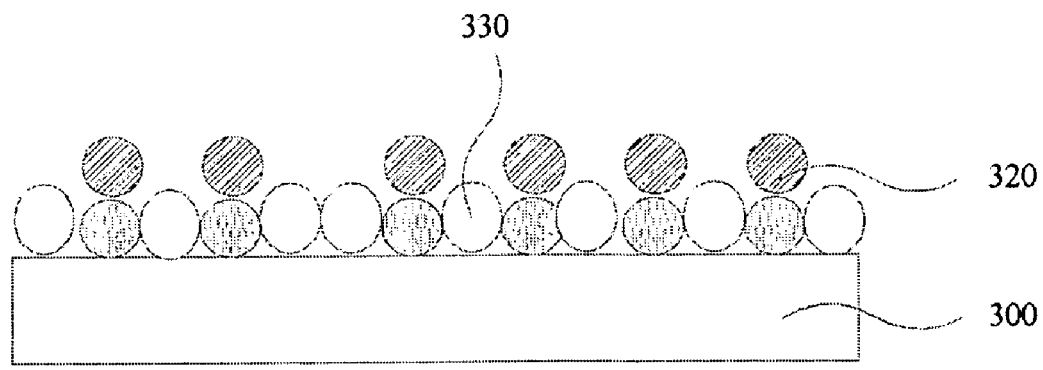

Referring to the FIG. 12, an inert purge gas is fed to the semiconductor substrate in the deposition chamber to remove the third precursor gas which has not formed the third monolayer above the semiconductor substrate and the discrete atomic size islands. The inert gas can be He, Ne, Ar and the like. The purging of the inert gas can be performed according to any of the conventional processes in the prior art.

Figure 13:
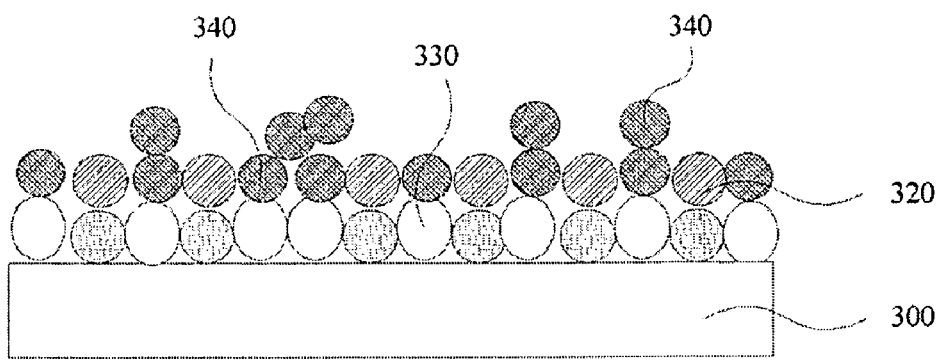

Referring to the FIG. 13, the fourth precursor gas is fed to the semiconductor substrate 300 in the deposition chamber and reacts with the third precursor gas which has formed the third monolayer 330 so as to form a dielectric monoatomic layer 340. In this embodiment, the feeding to the semiconductor substrate in the deposition chamber only represents the direction of the gas flow, and does not means that the gas does always flow onto the semiconductor substrate each time.

The third precursor gas forming the third monolayer 330 includes a first portion of precursor gas which fills the space between the discrete atomic size islands 320, and a second portion of precursor gas which lies on the discrete atomic size islands 320 and absorbs with the third monolayer 330.

The fourth precursor gas reacts with the third precursor gas to form a dielectric monoatomic layer 340, which can be the monoatomic layer of insulation materials such as silicon oxide, silicon nitride, and silicon oxynitride.

For example, in a particular example, if the final dielectric monoatomic layer to be formed is $Si_3N_4$, the fourth precursor gas can be $NH_3$, $N_2O$, $N_2$ and the like.

If the final dielectric monoatomic layer to be formed is $SiO_2$, the fourth precursor gas can be $NH_3$, $N_2O$, $O_2$ and the like.

The process of feeding the third precursor gas into the semiconductor substrate in the deposition chamber can be performed by any conventional techniques known to the skilled in the art.

Figure 14:
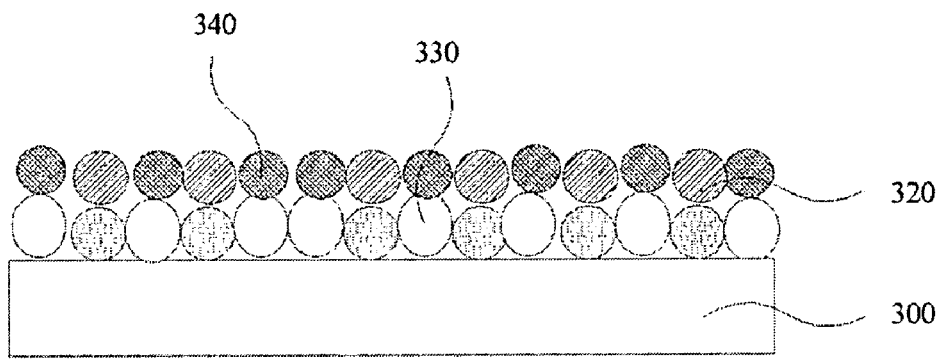

Referring to the FIG. 14, an inert purge gas is fed to the semiconductor substrate in the deposition chamber to remove the fourth precursor gas which has not formed the dielectric monoatomic layer and byproducts produced by the reaction between the third and the fourth precursor gases. The inert gas can be He, Ne, Ar and the like. The purging of the inert gas can be performed according to any of the conventional processes in the prior art.

Figure 15:
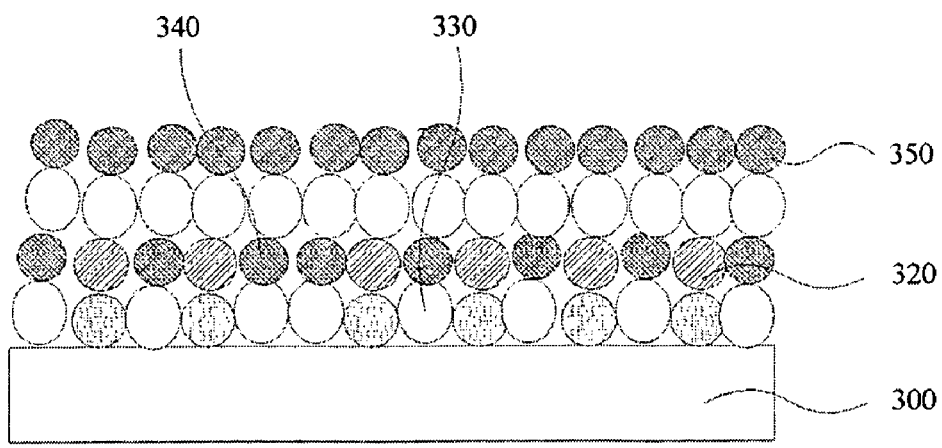

Referring to the FIG. 15, the deposition process of the dielectric monoatomic layer is performed more than one time to form a dielectric layer with a given thickness covering the monolayer of discrete atomic size islands.

The process for continuously forming dielectric layers on the dielectric monoatomic layer are the same as the steps as described in the FIGS. 11-14. The embodiment provides a process for forming another dielectric monoatomic layer on the dielectric monoatomic layer, comprising the steps of:

1) feeding a fifth precursor gas to the semiconductor substrate in the deposition chamber to form a fifth monolayer on both the dielectric monoatomic layer and the discrete atomic size islands, which covers the dielectric monoatomic layer and the monolayer of discrete atomic size islands;

wherein the fifth precursor gas is the same as the third precursor gas forming the third monolayer, which may be any of reaction gases having nucleation entities and being capable of effectively forming the fifth monolayer on the dielectric monoatomic layer and the monolayer of discrete atomic size islands through chemical or physical adsorption. Furthermore, the fifth precursor gas can react with a sixth precursor gas to form insulation materials, such as silicon oxide, silicon nitride, or silicon oxynitride.

2) feeding an inert purge gas to the semiconductor substrate in the atomic layer deposition chamber to remove the fifth precursor gas that does not form the fifth monolayer on the dielectric monoatomic layer and the monolayer of discrete atomic size islands.

3) feeding a sixth precursor gas to the semiconductor substrate in the atomic layer deposition chamber to react with the fifth precursor gas which has formed the fifth monolayer, thereby forming another dielectric monoatomic layer 350 on the dielectric monoatomic layer 340;

Wherein the sixth precursor gas is the same as the fourth precursor gas and reacts with the fifth precursor gas to form a dielectric monoatomic layer 350, which is a monoatomic layer of insulation materials such as silicon oxide, silicon nitride, silicon oxynitride and the like.

4) feeding an inert purge gas to the semiconductor substrate in the atomic layer deposition chamber to remove the sixth precursor gas which has not formed the dielectric monoatomic layer 350 and byproducts produced by the reaction between the fifth and the sixth precursor gases.

Another dielectric monoatomic layer 350 is formed by the process of step 1) to step 4) to cover the dielectric monoatomic layer 340 and the monolayer of discrete atomic size islands 320.

If necessary, the process of forming the dielectric monoatomic layer 340 or the dielectric monoatomic layer 350 can be repeated several times to obtain desired thickness.

In the process described in the embodiment, after forming a monolayer of discrete atomic size islands, a dielectric layer is formed on the discrete atomic size islands to cover and seal the islands. Depending on the requirement of the manufacture of semiconductor devices, the deposition process according to the invention can be used for manufacturing semiconductor devices, for example, forming an electron trapping layer of a memory device.

Embodiment 3

Figure 17:
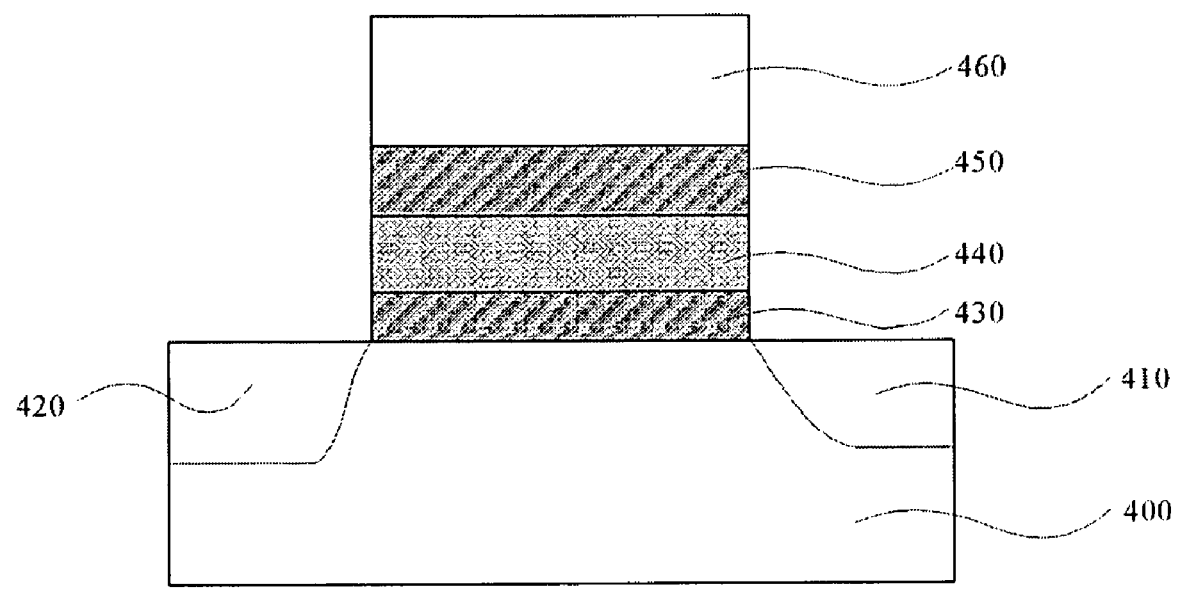
FIG. 17 is a structural diagram illustrating a semiconductor device according to a third embodiment of the present invention.

Referring to the FIG. 17, there is provided a semiconductor device in this embodiment, which comprises a semiconductor substrate 400, a three-layer stack structure of medium layer 430-charge trapping layer 440-medium layer 450 disposed on the semiconductor substrate 400, a gate 460 disposed on the three-layer stack structure, and a source 410 and a drain 420 disposed in the semiconductor substrate 400 at each side of the three-layer stack structure, wherein the charge trapping layer 440 is a dielectric layer containing the discrete atomic size islands formed by the ALD deposition method. Herein the word "containing" means that the discrete atomic size islands are embedded in the dielectric layer and covered by the dielectric layer.

The semiconductor substrate 400 can include silicon or silicon germanium (SiGe) with monocrystal or polycrystal structures, ion-doped Si or SiGe such as N-doped or P-doped Si or SiGe, compound semiconductor such as silicon carbide, indium antimonide, lead telluride, indium arsenide, indium phosphide, gallium arsenide or gallium antimonide, alloy semiconductor or the combination thereof, and silicon-on-insulator (SOI).

In the three-layer stack structure of medium layer 430-charge trapping layer 440-medium layer 450, the medium layer 430 or 450 can be made of an insulation material such as $SiO_2$; the charge trapping layer 440 can be a dielectric layer containing a monolayer of discrete atomic size islands. The dielectric layer is made of insulation materials such as silicon oxide, silicon nitride, and silicon oxynitride. The discrete atomic size islands are sealed in the dielectric layer and distribute in uniform or non-uniform monoatomic state to form discrete nano-dots. The islands can be any of the substance used for trapping charges in a charge trapping layer of a semiconductor device in the prior art, such as $SiO_2$, $Si_3N_4$, $Al_2O_3$, HfO, or WN.

The process for forming the dielectric layer containing a monolayer of discrete atomic size islands is described in the embodiment 2. Herein the word "containing" means that the discrete atomic size islands are embedded in the dielectric layer and covered by the dielectric layer.

The monolayer of discrete atomic size islands is formed by an atomic layer deposition process, referring to the description in the first embodiment.

The gate 460 can be a multilayer structure comprising semiconductor materials, such as Si, Ge, metal or the combination thereof.

The source 410 and the drain 420 are located in the semiconductor substrate 400 at each side of the three layer stack structure. In the FIG. 17, the position of the source 410 and the drain 420 can be exchanged with each other. And the doping ions can be one or more of phosphorus ion, arsenic ion, boron ion, or indium ion.

In the semiconductor device provided by the embodiment, the charge trapping layer is a dielectric layer containing a monolayer of discrete atomic size islands, the size of the islands is at atomic level and is controllable. Furthermore, the distribution density of the islands in the dielectric layer can be adjusted by controlling the atomic layer deposition process for forming the monolayer of discrete atomic size islands.

The present invention is capable of improving the density of the charge trapping well in the charge trapping layer and thus the charge trapping capability, even if the semiconductor device has a small line width. And it can further improve the insulating capacity between the discrete islands, thereby reducing lateral current leakage of the device.

While the present invention has been described with respect to certain preferred embodiments, it will be apparent to those skilled in the art that various changes and modifications may be made without departing from the spirit and scope of the invention as defined in the following claims.

What is claimed is:

1. An atomic layer deposition method comprising the steps of:
   placing a semiconductor substrate in an atomic layer deposition chamber;
   feeding a first precursor gas to the semiconductor substrate within the chamber to form a first discrete monolayer on the semiconductor substrate;
   feeding a first inert purge gas to the semiconductor substrate within the chamber to react with the first precursor gas which has not formed the first discrete monolayer on the semiconductor substrate;
   feeding a second precursor gas to the chamber to react with the first precursor gas which has formed the first discrete monolayer, thereby forming discrete atomic size islands;
   after purging by the first inert purge gas, a uniform or non-uniform first monolayer is formed in a monoatomic discrete distribution;
   feeding a second inert purge gas to the semiconductor substrate within the chamber to remove the second precursor gas which has not reacted with the first precursor gas and byproducts produced by the reaction between the first and the second precursor gases; and
   forming a dielectric layer to fill spaces between the discrete atomic size islands and cover the discrete atomic size islands on the semiconductor substrate.

2. The atomic layer deposition method according to claim 1, wherein the step of forming the dielectric layer is an atomic layer deposition process.

3. The atomic layer deposition method according to claim 2, wherein the step of forming the dielectric layer comprises:
   feeding a third precursor gas to the chamber to form a third monolayer over the semiconductor substrate and the discrete atomic size islands, wherein the third monolayer fills the space between the discrete atomic size islands;
   feeding an inert purge gas to the chamber to remove the third precursor gas which has not formed the third monolayer above the semiconductor substrate and the discrete atomic size islands;
   feeding a fourth precursor gas to the chamber to react with the third precursor gas which has formed the third monolayer so as to form a dielectric monoatomic layer;
   feeding an inert purge gas to the chamber to remove the fourth precursor gas which has not formed the dielectric monoatomic layer and byproducts produced by the reaction between the third and the fourth precursor gases; and
   repeating the above steps until the resulting dielectric layer has a given thickness to cover the discrete atomic size islands.

4. The atomic layer deposition method according to claim 1, wherein the second precursor gas comprises $NH_3$, $N_2O$, $N_2$, $O_2$, $O_3$, or $H_2O$.

5. The atomic layer deposition method according to claim 2, wherein the dielectric layer is silicon oxide, silicon nitride, or silicon oxynitride.

6. The atomic layer deposition method according to claim 4, wherein when the second precursor gas is $NH_3$, the second precursor gas is fed to the chamber at a flow rate of 2 to 5 slm for a period of 0 to 30 seconds.

7. The atomic layer deposition method according to claim 1, wherein when the first precursor gas is fed to the semiconductor substrate within the chamber for a period of 0 to 7 seconds.

8. The atomic layer deposition method according to claim 1, wherein the first precursor gas is fed to the semiconductor substrate within the chamber under a pressure of 3 to 5 Pa.

9. The atomic layer deposition method according to claim 1, wherein a flow rate and feeding time of the first precursor is lower than that in a process for forming a continuous monolayer.

10. The atomic layer deposition method according to claim 1, wherein the first precursor is selected from the group consisting of metal, semiconductor, metal bonded to halogen or organic ligands, and semiconductor bonded to halogen or organic ligands, or the mixture thereof.

11. The atomic layer deposition method according to claim 10, wherein the metal is selected from the group consisting of Ta, Ti, W, Mo, Nb, Cu, Ni, Pt, Ru, Me, Ni and Al.

12. The atomic layer deposition method according to claim 10, wherein the semiconductor is silicon.

13. The atomic layer deposition method according to claim 10, wherein the metal bonded to halogen or organic ligands comprises $Al(CH_3)_3$, $Hf[N(CH_3)(C_2H_5)]_4$, $Hf[N(C_2H_5)_2]_4$, $Hf[OC(CH_3)_3]_4$ or $HfCl_4$, and the semiconductor bonded to halogen or organic ligands comprises $SiCl_2H_2$, $Si(OC_2H_5)_4$, $Si_2Cl_6$, $SiH_2[NH(C_4H_9)]_2$ or $SiH(OC_2H_5)_3$.

14. The atomic layer deposition method according to claim 1, wherein when the first precursor gas is $SiCl_2H_2$, the first precursor gas is fed to the semiconductor substrate within the chamber at a flow rate of 0.06 to 0.3 slm for a period of more than 0 to 10 seconds.

* * * * *